United States Patent
Yoshida et al.

(10) Patent No.: US 8,125,078 B2
(45) Date of Patent: Feb. 28, 2012

(54) SEMICONDUCTOR ELEMENT COOLING STRUCTURE

(75) Inventors: Tadafumi Yoshida, Nisshin (JP); Hiroshi Osada, Komaki (JP); Yutaka Yokoi, Seto (JP)

(73) Assignee: Toyota Jidosha Kabushiki Kaisha, Aichi-Ken (JP)

( * ) Notice: Subject to any disclaimer, the term of this patent is extended or adjusted under 35 U.S.C. 154(b) by 236 days.

(21) Appl. No.: 12/521,225

(22) PCT Filed: Jan. 9, 2008

(86) PCT No.: PCT/JP2008/050461
§ 371 (c)(1),
(2), (4) Date: Jun. 25, 2009

(87) PCT Pub. No.: WO2008/084870
PCT Pub. Date: Jul. 17, 2008

(65) Prior Publication Data
US 2010/0090336 A1    Apr. 15, 2010

(30) Foreign Application Priority Data
Jan. 11, 2007 (JP) ................ 2007-003651

(51) Int. Cl.
*H01L 23/34* (2006.01)
(52) U.S. Cl. .......... 257/717; 257/712; 257/E23.08
(58) Field of Classification Search .......... 257/276, 257/625, 675, 706, 707, E33.075, E31.131, 257/E23.051, E23.08–E23.113, 712–722, 257/E23.131; 165/164, 165, 167–176
See application file for complete search history.

(56) References Cited

U.S. PATENT DOCUMENTS

| 5,275,237 | A | * | 1/1994 | Rolfson et al. ............. 165/80.5 |
| 5,774,334 | A | * | 6/1998 | Kawamura et al. ........... 361/699 |
| 6,351,384 | B1 | | 2/2002 | Daikoku et al. |
| 7,092,254 | B1 | * | 8/2006 | Monsef et al. ............. 361/699 |
| 2003/0016499 | A1 | | 1/2003 | Tanaka et al. |

FOREIGN PATENT DOCUMENTS

| JP | 04-002156 A | 1/1992 |
| JP | 10-200278 A | 7/1998 |

(Continued)

OTHER PUBLICATIONS

Chinese Office Action issued for Chinese Patent Application No. 200880002205.6, dated Apr. 14, 2010 with English Translation.

(Continued)

*Primary Examiner* — Jasmine Clark
(74) *Attorney, Agent, or Firm* — Sughrue Mion, PLLC

(57) ABSTRACT

A semiconductor element cooling structure includes first and second semiconductor elements; a heat sink having a mounting surface on which the semiconductor elements are mounted and a cooling medium channel formed inside, through which a cooling medium for cooling the semiconductor elements flows; and a protruded portion provided at a position opposite to the mounting surface of the heat sink, extending in a direction intersecting flow direction of the cooling medium (direction of arrow DR1) and protruding from a bottom surface of the cooling medium channel to the inside of cooling medium channel. The semiconductor elements are arranged side by side in the direction of arrow DR1, such that the first semiconductor element is positioned upstream side than the second semiconductor element. A protruded portion for the second semiconductor element is provided to be positioned on the downstream side of first semiconductor element and upstream side than the center of second semiconductor element in the direction of arrow DR1.

11 Claims, 5 Drawing Sheets

FOREIGN PATENT DOCUMENTS

| | | |
|---|---|---|
| JP | 2001-053206 A | 2/2001 |
| JP | 2001-352025 A | 12/2001 |
| JP | 2002-141164 A | 5/2002 |
| JP | 2003-224238 A | 8/2003 |
| JP | 2003-314942 A | 11/2003 |
| JP | 2004-103936 A | 4/2004 |
| JP | 2004-119939 A | 4/2004 |
| JP | 2004-128439 A | 4/2004 |
| JP | 2008-135757 A | 6/2008 |

OTHER PUBLICATIONS

Japanese Office Action issued for Japanese Patent Application No. 2007/003651, mailed Jun. 1, 2010 with English Translation.

* cited by examiner

SEMICONDUCTOR ELEMENT COOLING STRUCTURE

TECHNICAL FIELD

The present invention relates to a semiconductor element cooling structure and, more specifically, to a semiconductor element cooling structure mounted on a heat sink having a cooling medium channel.

BACKGROUND ART

Cooling devices for cooling heat-generating bodies such as semiconductor elements have been conventionally known. By way of example, Japanese Patent Laying-Open No. 2004-103936 (Patent Document 1) describes a semiconductor element provided with a heat sink for dissipating heat from the semiconductor element. Here, a plurality of protruded portions are formed on an inner wall of a cover forming a cooling medium channel.

Japanese Patent Laying-Open No. 10-200278 (Patent Document 2) describes a cooling device having fins bent continuously in the shape of waves in the cooling air passing direction.

Japanese Patent Laying-Open No. 2004-119939 (Patent Document 3) describes improvement of cooling efficiency by providing a wire loop in a heat sink.

Further, Japanese Patent Laying-Open No. 2001-352025 (Patent Document 4) describes a cooling device in which flow path width is changed depending on a distance from a cooling medium inlet.

When a cooling medium is caused to flow through a cooling medium channel formed in a heat sink, boundary layer develops on a wall surface of the cooling medium channel as the flow proceeds to downstream side. Flow velocity of cooling medium decreases at the boundary layer and, therefore, development of boundary layer leads to lower cooling efficiency.

From a viewpoint of improving cooling efficiency, it may be possible to increase heat transfer area by miniaturizing the channel. If the channel is miniaturized, however, pressure loss would increase.

In ebullient cooling in which the cooling medium boils, bubble membranes form on a heat transfer surface, and the bubble membranes possibly hinder cooling by the cooling medium.

It is preferred to generate turbulence in the flow of cooling medium, in order to prevent development of boundary layer or bubble membranes described above. Patent Documents 1 to 4 mentioned above, however, do not disclose any structure that can effectively generate turbulence and improve cooling efficiency. For instance, in Patent Document 1, though protruded portions are formed on an inner surface of a case forming the cooling medium channel, the protruded portions extend along the flowing direction of cooling medium and, therefore, the protruded portions do not promote turbulence generation sufficiently to improve cooling efficiency.

DISCLOSURE OF THE INVENTION

An object of the present invention is to provide a semiconductor element cooling structure attaining high cooling efficiency.

According to an aspect, the present invention provides a semiconductor element cooling structure, including: a semiconductor element; a heat sink having a mounting surface on which the semiconductor element is mounted, and having a cooling medium channel formed inside, through which cooling medium for cooling the semiconductor element flows; and a protruded portion provided at a position opposite to the mounting surface of the heat sink, extending in a direction intersecting a flow direction of the cooling medium, and protruded from a wall surface of the cooling medium channel to the inside of cooling medium channel; wherein the protruded portion is provided close to the semiconductor element and upstream side than the center of the semiconductor element in the flow direction of cooling medium.

As an example, the semiconductor element cooling structure described above further includes a second semiconductor element mounted on the mounting surface; wherein the semiconductor element and the second semiconductor element are arranged side by side such that the second semiconductor element is positioned on upstream side than the semiconductor element; and the protruded portion is provided downstream side than the second semiconductor element and upstream side than the center of the semiconductor element in the flow direction of cooling medium.

In the structure described above, a protruded portion is formed protruded from the bottom surface of the cooling medium channel and, therefore, flow velocity distribution with higher flow velocity on the mounting surface side near the semiconductor element can be realized, and turbulence can be generated in the flow of cooling medium, whereby development of boundary layer can be prevented. As a result, heat transfer efficiency by the cooling medium improves and semiconductor element cooling efficiency improves.

Preferably, the semiconductor element cooling structure described above further includes a second protruded portion provided at a position opposite to the protruded portion of the heat sink, extending in a direction intersecting the flow direction of cooling medium, protruded from a wall surface of the cooling medium channel to the inside of cooling medium channel and positioned on upstream side of the protruded portion.

In the structure described above, the pair of protruded portions provided at the upper and bottom surfaces of cooling medium channel facilitates formation of flow of cooling medium toward the semiconductor element mounting portion and, therefore, efficiency of cooling semiconductor element can further be improved.

In the structure above, "extend in a direction intersecting the flow direction of cooling medium" encompasses both continuous extension in a direction intersecting the flow direction of cooling medium and intermittent extension in a direction intersecting the flow direction of cooling medium.

According to another aspect, the present invention provides a semiconductor element cooling structure, including: a semiconductor element; and a heat sink having a mounting surface on which the semiconductor element is mounted, and having a cooling medium channel formed inside, through which cooling medium for cooling the semiconductor element flows; wherein the heat sink includes a first member including the mounting surface and a second member provided opposite to the first member; the first member has a plurality of fins formed along the cooling medium channel and protruded from a wall surface of the cooling medium channel to the inside of cooling medium channel; and the second member has a protruded portion formed to be fit between the plurality of fins at a part in a longitudinal direction of the fins and protruded from a wall surface of the cooling medium channel to the inside of cooling medium channel.

In the structure described above, protruded portions are formed protruded from the bottom surface of the cooling medium channel and, therefore, flow velocity distribution with higher flow velocity on the mounting surface side near the semiconductor element can be realized, and turbulence can be generated in the flow of cooling medium, whereby development of boundary layer can be prevented. As a result, heat transfer efficiency by the cooling medium improves and semiconductor element cooling efficiency improves. Further, as the first and second members are combined such that the protruded portion fits in between the fins, positioning of the first and second members becomes easier when the heat sink is formed.

Preferably, in the semiconductor element cooling structure described above, the protruded portion is provided at a position that directs flow of cooling medium flowing through the cooling medium channel to the semiconductor element.

As an example, in the semiconductor element cooling structure described above, the semiconductor element is included in a controller controlling a rotating electric machine driving a vehicle.

As described above, by the present invention, efficiency of cooling semiconductor elements can be improved.

It is noted that two or more of the structures described above may be combined.

BEST MODES FOR CARRYING OUT THE INVENTION

Figure 1:
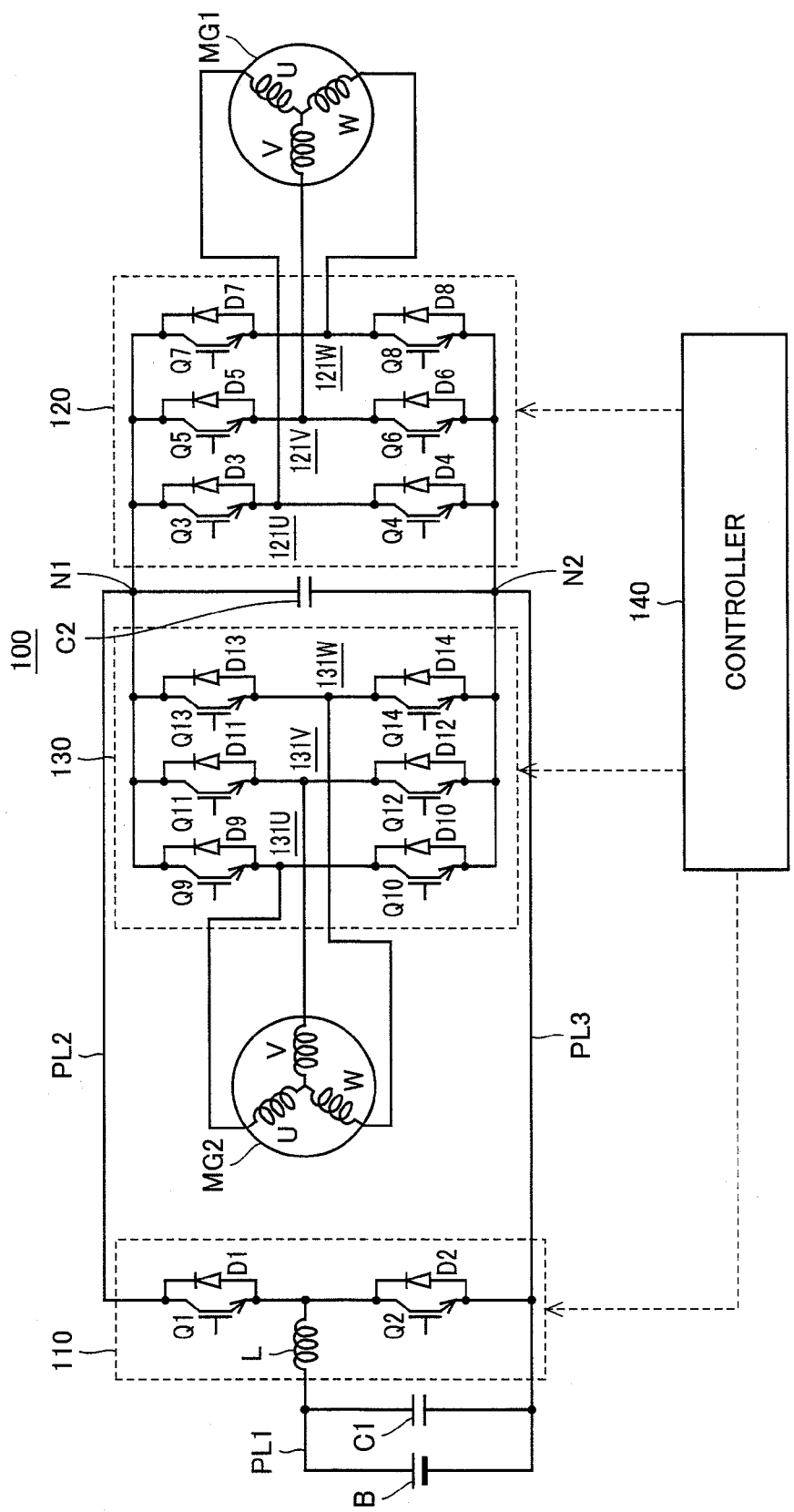
FIG. 1 is a circuit diagram showing a structure of a main portion of a PCU to which the semiconductor element cooling structure in accordance with an embodiment of the invention is applied.

In the following, embodiments of the present invention will be described. It is noted that the same or corresponding portions are denoted by the same reference characters, and description thereof may not be repeated.

In the embodiments described in the following, descriptions of numbers, amounts and the like are not intended to limit the scope of the invention unless otherwise specified. Further, in the embodiments below, each component is not always necessary, unless otherwise specified. When a plurality of embodiments are possible, it is naturally expected that structures of various embodiments are appropriately combined, unless otherwise specified.

FIG. 1 is a circuit diagram showing a configuration of a main portion of PCU to which the semiconductor element cooling structure in accordance with an embodiment of the present invention is applied. It is noted that PCU 100 shown in FIG. 1 represents a "controller for a rotating electric machine driving a vehicle."

Referring to FIG. 1, PCU 100 includes a converter 110, inverters 120 and 130, a controller 140, and capacitors C1 and C2. Converter 110 is connected between a battery B and inverters 120 and 130, and inverters 120 and 130 are connected to motor generators MG1 and MG2, respectively.

Converter 110 includes power transistors Q1 and Q2, diodes D1 and D2, and a reactor L. Power transistors Q1 and Q2 are connected in series, and each at its base, receive a control signal from controller 140. Diodes D1 and D2 are connected between collector and emitter of power transistors Q1 and Q2, respectively, to cause current flow from emitter side to collector side of power transistors Q1 and Q2, respectively. Reactor L has one end connected to a power line PL1 connected to a positive electrode of battery B, and the other end connected to a node between power transistors Q1 and Q2.

Converter 110 boosts DC voltage received from battery B using reactor L, and supplies the boosted voltage to a power line PL2. Further, converter 110 lowers the DC voltage received from inverter 120, 130, and with this voltage, charges battery B.

Inverters 120 and 130 include U-phase arms 121U and 131U, V-phase arms 121V and 131V, and W-phase arms 121W and 131W, respectively. U-phase arm 121U, V-phase arm 121V and W-phase arm 121W are connected in parallel between nodes N1 and N2. Similarly, U-phase arm 131U, V-phase arm 131V and W-phase arm 131W are connected in parallel between nodes N1 and N2.

U-phase arm 121U includes series-connected two power transistors Q3 and Q4. Similarly, U-phase arm 131U, V-phase arms 121V and 131V and W-phase arms 121W and 131W include series-connected two power transistors Q5 to Q14, respectively. Between collector and emitter of each of the power transistors Q3 to Q14, diodes D3 to D14, causing current flow from emitter side to collector side, are connected, respectively.

A middle point of the arm of each phase in inverters 120 and 130 is connected to an end of each phase of coils of respective phases in motor generators MG1 and MG2. Motor generators MG1 and MG2 are formed by three coils of U, V and W phases, each having one end connected commonly to a mid point.

Capacitor C1 is connected between power lines PL1 and PL3, and smoothes voltage level of power line PL1. Further, capacitor C2 is connected between power lines PL2 and PL3, and smoothes voltage level of power line PL2.

Inverters 120 and 130 convert a DC voltage from capacitor C2 to an AC voltage based on a drive signal from controller 140, and thereby drive motor generators MG1 and MG2.

Controller 140 calculates coil voltages of respective phases of motor generators MG1 and MG2, based on a motor torque command value, phase current values of motor generators MG1 and MG2, and input voltages of inverters 120 and 130, and based on the result of calculation, generates and outputs to inverters 120 and 130 a PWM (Pulse Width Modulation) signal for turning on/off power transistors Q3 to Q14.

Further, controller 140 calculates duty ratio of power transistors Q1 and Q2 for optimizing input voltages to inverters 120 and 130 based on the motor torque command value and motor rotation number mentioned above, and based on the result of calculation, generates and outputs to converter 110 a PWM signal for turning on/off power transistors Q1 and Q2.

Further, controller 140 controls switching operations of power transistors Q1 to Q4 of converter 110 and inverters 120 and 130, in order to convert the AC power generated by motor generators MG1 and MG2 to DC power and thereby to charge battery B.

When PCU 100 operates, power transistors Q1 to Q14 and diodes D1 to D14 forming converter 110 and inverters 120 and 130 generate heat. Therefore, it is necessary to provide a cooling structure for promoting cooling of these semiconductor elements.

Figure 2:
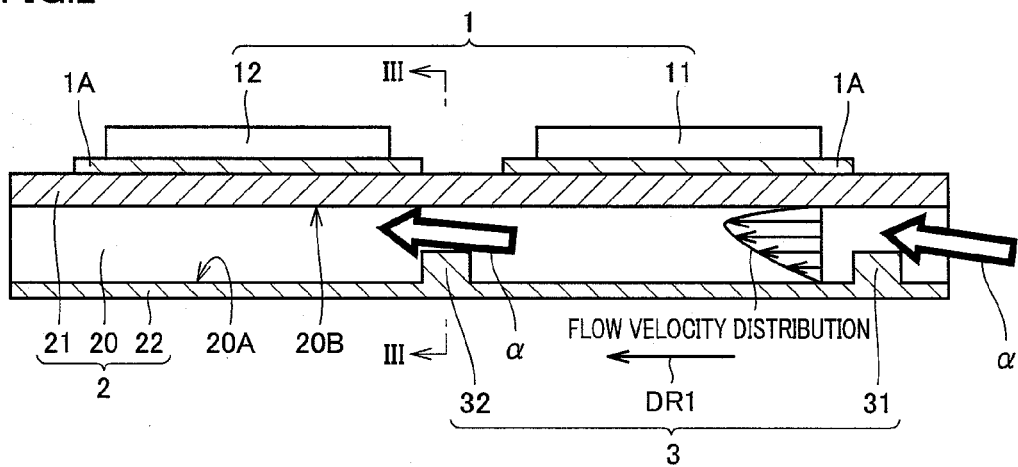
FIG. 2 is a cross-sectional view showing a semiconductor element cooling structure in accordance with an embodiment of the present invention.
Figure 3:
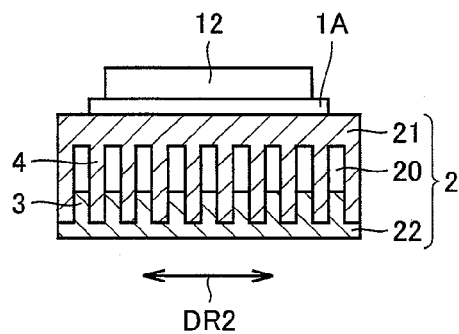
FIG. 3 is a cross-sectional view taken along the line of FIG. 2.
Figure 4:
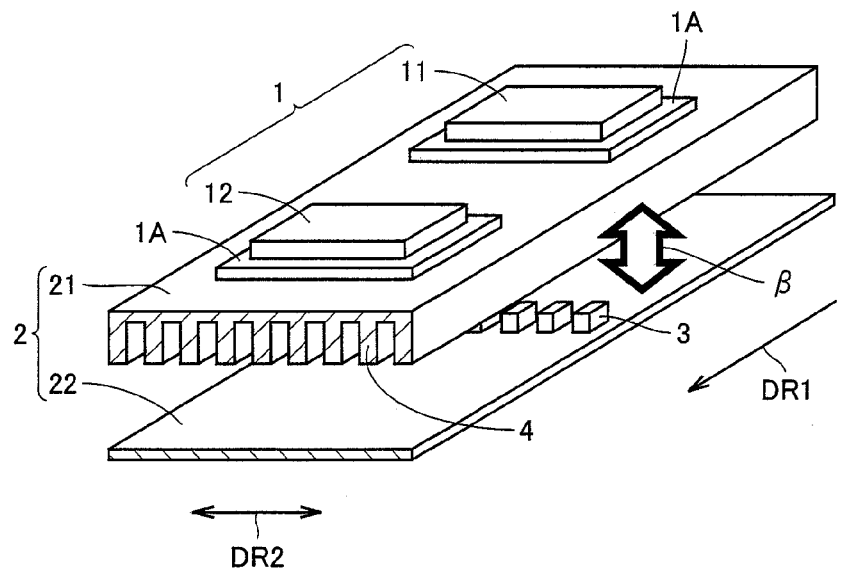
FIG. 4 is an exploded perspective view of the cooling structure shown in FIGS. 2 and 3.

FIG. 2 is a cross-sectional view showing a semiconductor element cooling structure in accordance with an embodiment of the present invention. FIG. 3 is a cross-sectional view taken along the line of FIG. 2. FIG. 4 is an exploded perspective view of the cooling structure shown in FIGS. 2 and 3. Referring to FIGS. 2 to 4, the semiconductor element cooling structure in accordance with the present embodiment is formed to include a semiconductor element 1 and a heat sink 2 on which semiconductor element 1 is mounted.

Semiconductor element 1 represents, for example, power transistors Q1 to Q14 and diodes D1 to D14 of FIG. 1. In the example shown in FIG. 2, a plurality of semiconductor elements 11 and 12 are shown as semiconductor element 1. Semiconductor element 1 (11, 12) is mounted on heat sink 2 with a mounting structure 1A interposed. Heat sink 2 is formed of a metal having relatively high heat transfer coefficient, such as copper or aluminum. Heat sink 2 is formed including first and second members 21 and 22. Between the first and second members 21 and 22, a cooling medium channel 20 is formed. By the cooling medium caused to flow through cooling medium channel 20, semiconductor element 1 is cooled.

As shown in FIGS. 3 and 4, the first member 21 has a plurality of fins 4 protruding toward second member 22. Fins 4 extend in the direction of extension of cooling medium channel 20, that is, the direction to which cooling medium flows (the direction indicated by arrow DR1). The second member 22 has a plurality of protruded portions 3 protruding toward first member 21. The plurality of protruded portions 3 and fins 4 are provided to mesh with each other as shown in FIG. 3. Further, fins 4 define the height of cooling medium channel 20. When heat sink 2 is formed, first and second members 21 and 22 are combined along the direction of arrow 13 such that protruded portions 3 and fins 4 mesh, as shown in FIG. 4. In the manner as described above, a channel-type cooling medium channel 20 partitioned by fins 4 is formed in heat sink 2.

When semiconductor element 1 is cooled by causing cooling medium to flow through cooling medium channel 20, a boundary layer tends to develop near a wall surface of cooling medium channel 20, so that the flow velocity of cooling medium tends to decrease. Further, in ebullient cooling in which the cooling medium boils, bubble membranes are formed on an upper surface 20B of cooling medium channel 20 positioned below the mounting portion of semiconductor element 1. As the flow velocity of cooling medium decreases on the side of upper surface 20B of cooling medium channel 20 and the bubble membranes form, efficiency of cooling semiconductor element 1 tends to decrease.

The inventors conceived an approach for improving the efficiency of cooling semiconductor element 1, in which a protruded portion 3 (31, 32) is formed to extend in a direction intersecting the flow direction of cooling medium (direction of arrow DR1) and protruding from bottom surface 20A of cooling medium channel 20 to the inside of cooling medium channel 20. Again referring to FIG. 2, protruded portion 3 includes protruded portions 31 and 32 arranged side by side in the direction of arrow DR1. Protruded portions 31 and 32 are formed at positions close to semiconductor elements 11 and 12 in cooling medium channel 20, respectively. Protruded portions 31 and 32 are formed to extend intermittently (to be divided by fins 4) along the direction (direction of arrow DR2) intersecting the flow direction of cooling medium. In the example shown in FIG. 2, protruded portions 31 and 32 are formed on upstream side of semiconductor elements 11 and 12, respectively. In FIG. 2, arrow a represents a local flow of cooling medium.

Since protruded portions 3 as described above are provided, it becomes possible to deflect the flow of cooling medium and to generate turbulence at positions where semiconductor elements 1 are mounted and, in addition, it becomes possible to increase flow velocity of cooling medium on the side of mounting surface of semiconductor elements 1 and thereby to prevent development of boundary layer. As a result, efficiency of cooling semiconductor elements 1 can be improved.

The position where protruded portion 3 is formed may be changed appropriately. Typically, it is provided to be positioned on the upstream side of each semiconductor element 1. In the example shown in FIG. 2, protruded portion 32 provided on the upstream side of semiconductor element 12 is positioned between semiconductor elements 11 and 12 (in other words, on the downstream side of semiconductor element 11 and the upstream side of semiconductor element 12). Protruded portion 3 may be formed to overlap semiconductor element 1. By way of example, protruded portion 32 shown in FIG. 2 may be provided directly below semiconductor element 12. Even in that case, the same effects as described above can be attained as long as the protruded portion 32 is provided on the upstream side than the center (in the direction of arrow DR1) of semiconductor element 12.

Further, as the protruded portion 3 is formed at such a position as described above, the flow of cooling medium flowing through cooling medium channel is directed to semiconductor element 1. As the flow of cooling medium directed to semiconductor element 1 collides against an upper surface 20B of cooling medium channel 20 positioned directly below semiconductor element 1, bubble membranes mentioned above burst. As a result, efficiency of cooling semiconductor element 1 can further be improved.

Figure 5:
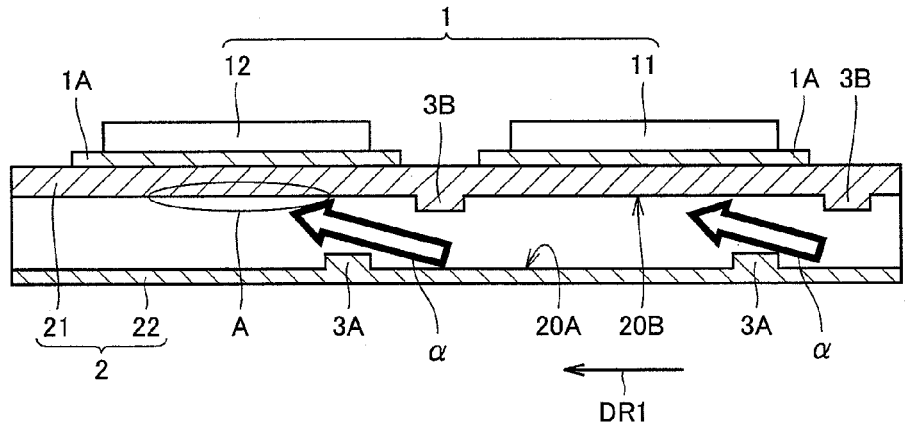
FIG. 5 is a cross-sectional view showing a modification of the semiconductor element cooling structure in accordance with an embodiment of the present invention.

FIG. 5 is a cross-sectional view showing a modification of the cooling structure shown in FIGS. 2 to 4. Referring to FIG. 5, in the present modification, a protruded portion 3A protruding upward from second member 22 is provided and, in addition, a protruded portion 2B protruding downward from the first member 21 is provided. In other words, in the example of FIG. 5, a protruded portion 3A protruding from the bottom surface 20A of cooling medium channel 20 to the inside of cooling medium channel 20 and a protruded portion 3B protruding from the upper surface 20B of cooling medium channel 20 to the inside of cooling medium channel 20 are provided. In the example of FIG. 5 again, protruded portions 3A and 3B are provided to extend in a direction intersecting the flowing direction of cooling medium. Further, arrow α in FIG. 5 represents local flow of cooling medium.

Provision of a pair of protruded portions 3A and 3B as described above makes it easier to guide the flow of cooling medium to a portion (for example, portion A of FIG. 5) positioned directly below semiconductor element 1 in heat sink 2. Therefore, further improvement of efficiency of cooling semiconductor element is expected.

Figure 6:
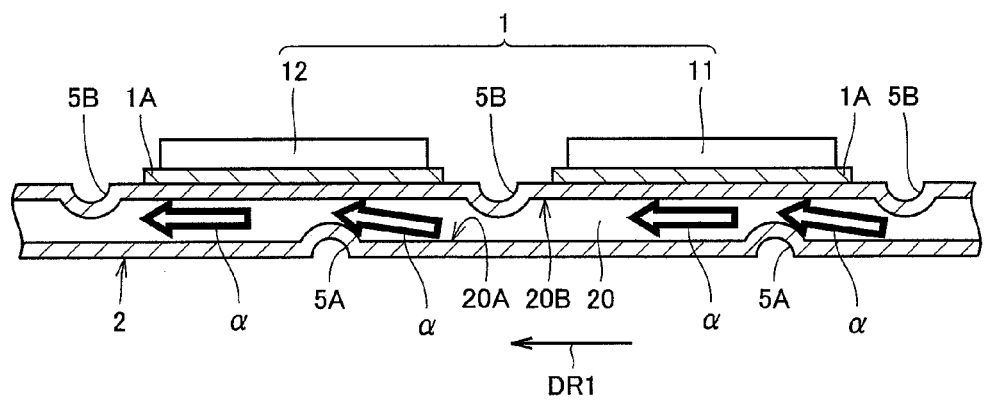
FIG. 6 is a cross-sectional view showing another modification of the semiconductor element cooling structure in accordance with an embodiment of the present invention.

Though cooling medium channel 20 formed by first and second members 21 and 22 has been described in the examples shown in FIGS. 2 to 5, heat sink 2 may be formed of one member with a hollow flow path formed therein, as shown in FIG. 6. In the example shown in FIG. 6, recesses 5A are formed on a lower surface (surface opposite to the mounting surface of semiconductor element 1) and recesses 5B are formed on an upper surface (mounting surface of semiconductor element 1) of one flat tube, whereby protruded portions protruding from bottom surface 20A and upper surface 20B of cooling medium channel 20 are formed. In the example of FIG. 6 also, recesses 5A and 5B for forming protruded portions are formed to extend in the direction intersecting the flow direction of cooling medium (direction of arrow DR1). Further, arrow a in FIG. 6 represents local flow of cooling medium.

By the structure shown in FIG. 6 also, efficiency of cooling semiconductor element can be improved as in the examples of FIGS. 2 to 5. Though stress generated in the flat tube possibly increases because of heat generated by semiconductor element 1, recesses 5A and 5B additionally attain an effect of relaxing stress increase.

Figure 7:
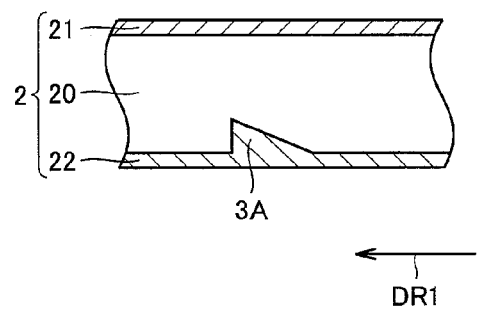
FIG. 7 shows a modification of the protruded portion in the cooling structure shown in FIGS. 2 to 6.
Figure 8:
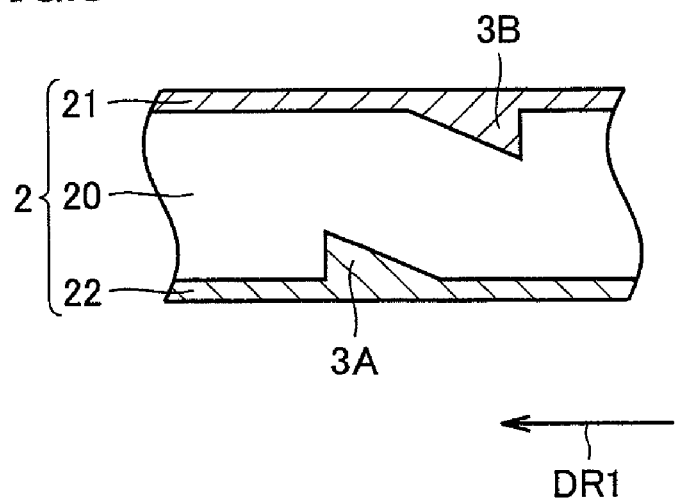
FIG. 8 shows another modification of the protruded portion in the cooling structure shown in FIGS. 2 to 6.

The shape of protruded portions is not limited to those shown in FIGS. 2 to 6, and a triangular shape such as shown in FIGS. 7 and 8 is also available.

Figure 9:
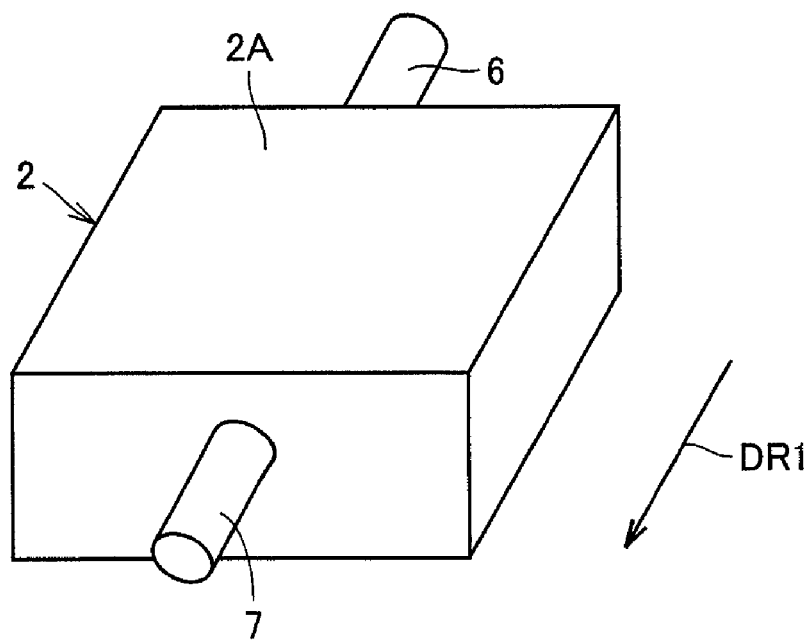
FIG. 9 is a perspective view showing a heat sink forming the semiconductor element cooling structure in accordance with an embodiment of the present invention.
Figure 10:
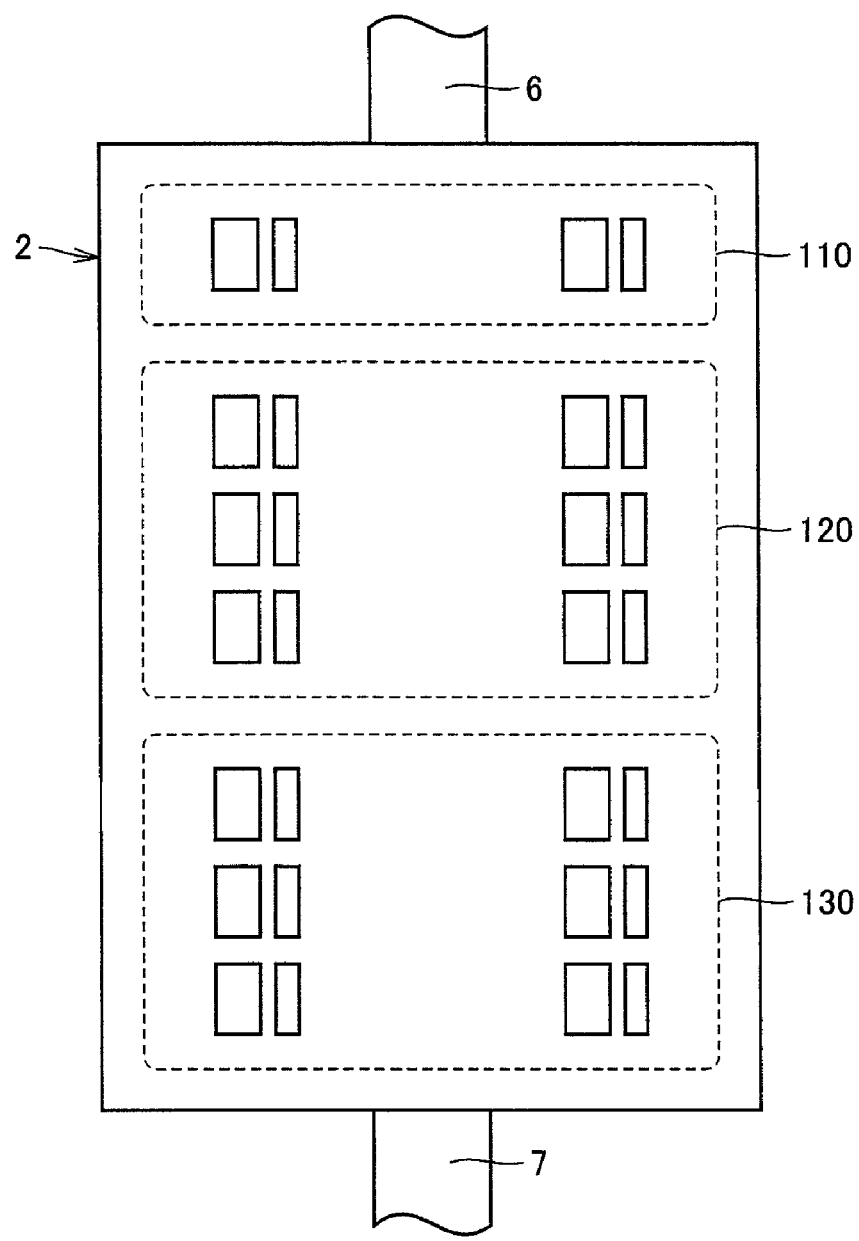
FIG. 10 is a top view showing an example of a state in which a semiconductor element is mounted on the heat sink shown in FIG. 9.

FIG. 9 is a perspective view showing the heat sink having the above-described cooling structure. FIG. 10 is a top view showing an example of a state in which a semiconductor element is mounted on the heat sink shown in FIG. 9. Referring to FIGS. 9 and 10, heat sink 2 has a mounting surface 2A on which semiconductor element 1 is mounted. As shown in FIG. 10, semiconductor elements 1 (power transistors Q1 to Q14 and diodes D1 to D14) included in converter 110 and inverters 120 and 130 are mounted on the mounting surface 2A. Heat sink 2 includes an inlet 6 and an outlet 7. The cooling medium cooled by a radiator (not shown) is introduced from inlet 6 to heat sink 2, and flows through cooling medium channel 20 formed in heat sink 2. After flowing through cooling medium channel 20, the cooling medium is discharged through outlet 7 and guided to the radiator, to be cooled again. In this manner, cooling of semiconductor element 1 is promoted.

The contents described above will be summarized in the following. Specifically, the semiconductor element cooling structure in accordance with the present embodiment includes: semiconductor element 1 including semiconductor element 12 and semiconductor element 11 as the "second semiconductor element"; heat sink 2 having a mounting surface 2A on which semiconductor element 1 is mounted and having cooling medium channel 20 formed therein, through which cooling medium for cooling semiconductor element 1 flows; and protruded portion 3 provided at a portion positioned opposite to the mounting surface 2A of heat sink 2, extending in a direction (direction of arrow DR2) intersecting the flow direction of cooling medium (direction of arrow DR1), and protruding from bottom surface 20A of cooling medium channel 20 to the inside of cooling medium channel 20. In the example shown in FIGS. 2 to 4, semiconductor elements 11 and 12 are arranged side by side in the direction of arrow DR1 such that semiconductor element 11 is positioned on the upstream side of semiconductor element 12, and protruded portion 32 for semiconductor element 12 is provided to be positioned on the downstream side of semiconductor element 11 and upstream side than the center of semiconductor element 12 in the direction of arrow DR1.

Further, in the example shown in FIGS. 2 to 4, heat sink 2 includes the first member 21 including mounting surface 2A and the second member 22 provided opposite to the first member 21. Here, the first member 21 has a plurality of fins 4 formed along the cooling medium channel 20 and protruding from upper surface 20B of cooling medium channel 20 to the inside of cooling medium channel 20. Further, the second member 22 has protruded portions 3 formed to be fit between the plurality of fins 4 at a part in the longitudinal direction of fins 4 and protruding from bottom surface 20A of cooing medium channel 20 to the inside of cooling medium channel 20.

In the example shown in FIG. 5, protruded portion 3A extending in the direction intersecting the flow direction of cooling medium and protruded from bottom surface 20A of cooling medium channel 20 to the inside of cooling medium channel 20, and protruded portion 3B as the "second protruded portion" extending in the direction intersecting the flow direction of cooling medium, protruded from upper surface 20B of cooling medium channel 20 to the inside of cooling medium channel 20 and positioned upstream side than protruded portion 3A are provided.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

INDUSTRIAL APPLICABILITY

The present invention is applicable, for example, to a semiconductor element cooling structure mounted on a heat sink having a cooling medium channel.

The invention claimed is:

1. A semiconductor element cooling structure, comprising:
   a semiconductor element;
   a heat sink having a mounting surface on which said semiconductor element is mounted, and having a cooling medium channel formed inside, through which cooling medium for cooling said semiconductor element flows; and
   a protruded portion provided at a position opposite to said mounting surface of said heat sink, extending in a direction intersecting a flow direction of said cooling medium, and protruded from a wall surface of said cooling medium channel to the inside of said cooling medium channel; wherein
   said protruded portion is provided close to said semiconductor element and at an upstream side of the center of said semiconductor element in said flow direction of cooling medium.

2. The semiconductor element cooling structure according to claim 1, further comprising
   a second semiconductor element mounted on said mounting surface; wherein
   said semiconductor element and said second semiconductor element are arranged side by side such that said second semiconductor element is positioned on upstream side than said semiconductor element; and
   said protruded portion is provided downstream side than said second semiconductor element and upstream side than the center of said semiconductor element in said flow direction of cooling medium.

3. The semiconductor element cooling structure according to claim 1, further comprising
   a second protruded portion provided at a position opposite to said protruded portion of said heat sink, extending in a direction intersecting a flow direction of said cooling medium, protruded from a wall surface of said cooling medium channel to the inside of said cooling medium channel and positioned on upstream side of said protruded portion.

4. The semiconductor element cooling structure according to claim 1, wherein
said semiconductor element is included in a controller controlling a rotating electric machine driving a vehicle.

5. A semiconductor element cooling structure, comprising:
a semiconductor element; and
a heat sink having a mounting surface on which said semiconductor element is mounted, and having a cooling medium channel formed inside, through which cooling medium for cooling said semiconductor element flows; wherein
said heat sink includes a first member including said mounting surface and a second member provided opposite to said first member;
said first member has a plurality of fins formed along said cooling medium channel and protruded from a wall surface of said cooling medium channel to the inside of said cooling medium channel; and
said second member has a protruded portion formed to be fit between said plurality of fins at a part in a longitudinal direction of said fins and protruded from a wall surface of said cooling medium channel to the inside of said cooling medium channel,
wherein said fins define the height of said cooling medium channel so as to form a channel-type cooling medium channel partitioned by said fins.

6. The semiconductor element cooling structure according to claim 5, wherein
said protruded portion is provided at a position that directs flow of cooling medium flowing through said cooling medium channel to said semiconductor element.

7. The semiconductor element cooling structure according to claim 5, wherein
said semiconductor element is included in a controller controlling a rotating electric machine driving a vehicle.

8. The semiconductor element cooling structure according to claim 6, wherein the position of said protruded portion is under said semiconductor element and offset from a center of said semiconductor element at an upstream side of the center.

9. The semiconductor element cooling structure according to claim 1, further comprising a plurality of fins extending along a direction to which cooling medium flows in said cooling medium channel, protruded from an upper surface of said cooling medium channel into the inside of said cooling medium channel and to a bottom surface of said cooling medium channel, said fins defining the height of said cooling medium channel, so as to form a channel-type cooling medium channel partitioned by said fins.

10. The semiconductor element cooling structure according to claim 1, wherein
said heat sink includes a first member including said mounting surface and a second member provided opposite to said first member;
said first member has a plurality of fins formed along said cooling medium channel and protruded from a wall surface of said cooling medium channel to the inside of said cooling medium channel; and
said protruded portion of said second member fits between said plurality of fins at a part in a longitudinal direction of said fins and protruded from a wall surface of said cooling medium channel to the inside of said cooling medium channel.

11. The semiconductor element cooling structure according to claim 10, wherein
said fins define the height of cooling medium channel so as to form a channel-type cooling medium channel partitioned by said fins.

* * * * *